United States Patent [19]

Fohrenkamm et al.

[11] Patent Number: 4,511,646

[45] Date of Patent: Apr. 16, 1985

[54] ETHYLENICALLY-UNSATURATED DEXTRIN COMPOSITION FOR PREPARING A DURABLE HYDROPHILIC PHOTOPOLYMER

[75] Inventors: Elsie A. Fohrenkamm, St. Paul; Alan D. Rousseau, Stillwater, both of Minn.

[73] Assignee: Minnesota Mining and Manufacturing Company, St. Paul, Minn.

[21] Appl. No.: 471,828

[22] Filed: Mar. 3, 1983

[51] Int. Cl.³ .............................. G03C 1/70; C08L 3/02
[52] U.S. Cl. ...................................... 430/283; 430/287; 430/288; 430/916; 430/302; 204/159.12; 204/159.15
[58] Field of Search ...................... 204/159.12, 159.15; 430/287, 283, 302, 916, 288

[56] References Cited

U.S. PATENT DOCUMENTS

| | | | |
|---|---|---|---|
| 3,016,823 | 1/1962 | Thurlow | 430/302 X |
| 3,085,008 | 4/1963 | Case | 96/75 |
| 3,419,394 | 12/1968 | Bach | 96/75 |
| 3,867,147 | 2/1975 | Teuscher | 96/33 |
| 4,060,506 | 11/1977 | Verbanac | 536/50 X |
| 4,079,025 | 3/1978 | Young et al. | 536/50 X |
| 4,147,549 | 4/1979 | Held | 96/85 |
| 4,196,065 | 4/1980 | Gaussens et al. | 204/159.15 X |
| 4,198,236 | 4/1980 | Held | 430/306 |
| 4,264,705 | 4/1981 | Allen | 430/302 X |

FOREIGN PATENT DOCUMENTS 7103065Q  3/1970  Netherlands ............... 430/302

Primary Examiner—John E. Kittle
Assistant Examiner—Cynthia Hamilton
Attorney, Agent, or Firm—Donald M. Sell; James A. Smith; David L. Weinstein

[57] ABSTRACT

A water-soluble photopolymerizable composition which is suitable for forming the hydrophilic layer in a positive acting water-developable lithographic printing plate. The photopolymerizable composition comprises a mixture of:

(a) an ethylenically-unsaturated dextrin oligomer,
(b) at least one hydroxyfunctional acrylamide monomer,
(c) inorganic solid particulate material, and
(d) a photoinitiation system. Wetting agents and pH modifiers can also be added to the composition. The photopolymer formed from the composition is water-insoluble.

11 Claims, No Drawings

ETHYLENICALLY-UNSATURATED DEXTRIN COMPOSITION FOR PREPARING A DURABLE HYDROPHILIC PHOTOPOLYMER

BACKGROUND OF THE DISCLOSURE

This invention relates to water-developable positive acting lithographic printing plates, and to a photosensitive, photopolymerizable composition for forming the hydrophilic portion of such a printing plate.

Positive acting water-developable lithographic printing plates having a photopolymerizable light-sensitive layer are known in the art. Such plates are described, for example, in U.S. Pat. Nos. 4,147,549 and 4,198,236. More particularly, these plates are prepared from positive-working photosensitive elements which comprise a support, a photosensitive layer or stratum and may have a strippable protective cover layer. The photosensitive layer contains an oleophilic polymer binder which is substantially insoluble in the water developer, a water soluble, ethylenically unsaturated monomer capable of undergoing photoinitiated addition polymerization to form a hydrophilic polymer which is substantially insoluble in the water developer, and an effective amount of a polymerization initiator activatable by actinic radiation and inactive thermally below 85° C. To prepare a planographic printing plate useful in offset lithography, the element is exposed to actinic radiation through a process positive transparency, the protective cover layer is stripped away and the surface of the exposed stratum is washed with water which leaches monomer from the unexposed areas of the stratum. The resulting stratum contains a positive image made up from an oleophilic ink receptive surface from which the monomer has been leached and a complementary hydrophilic surface comprised of the hydrophilic polymer formed. U.S. Pat. Nos. 3,867,147, 3,085,008, and 3,419,394 relate to lithographic plates comprising an oleophilic layer overcoated with a water-soluble hydrophilic material mixed with a diazo compound, said diazo compound being light sensitive and decomposable so as to effect crosslinking in the hydrophilic material. Upon curing, the hydrophilic polymer becomes water insoluble but remains hydrophilic.

Although the above-mentioned patents are several years old, as yet, no positive acting water-developable durable lithographic printing plate is commercially available because wet strength, scratch resistance, and solvent resistance are features for which problems still exist in the current art. Moreover, the state of the art requires gumming or similar types of post treatment or special fountains in order to maintain hydrophilicity of plates after development.

SUMMARY OF THE INVENTION

This invention involves a water-soluble composition for preparing a cross-linked hydrophilic photopolymer. The composition for producing this photopolymer can be coated from water, and, when cured by actinic radiation, provides a water insoluble, durable hydrophilic lithographic surface. The photopolymerizable composition comprises:
(a) an ethylenically unsaturated dextrin oligomer,
(b) at least one hydroxyfunctional acrylamide monomer,
(c) inorganic solid particulate material, and
(d) a photoinitiation system.

The composition acts as a photosensitive water soluble top layer in a water developable positive-working photosensitive element. Wetting agents can be incorporated into the composition of aiding in application to an oleophilic layer. Pigments can be added to color the coating. pH modifiers can also be incorporated into the composition to aid pigment dispersion.

The hydrophilic photopolymer resulting from the composition of this invention exhibits excellent wet strength and scratch resistance. In addition, when used as a lithographic plate surface, no gumming or post-treatment of any kind is required to maintain surface hydrophilicity during long periods of storage.

DETAILED DESCRIPTION

The ethylenically unsaturated dextrin oligomers suitable for the photopolymerizable composition of this invention are fully described in U.S. Ser. No. 471,781 U.S. Pat. No. 4,451,613, and incorporated herein by reference.

As used in this application, the term "anhydroglucose unit" means a unit having the following structure:

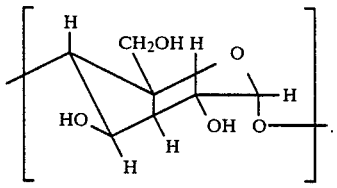

As used in this application, the term "degree of substitution" ("D.S.") means the average value of ethylenically unsaturated moiety per anhydroglucose unit, and the term "dextrin" means a carbohydrate intermediate in chain length between starch and glucose.

The dextrin oligomers contemplated for use in the photopolymerizable composition comprise the reaction product of
(1) 100 parts by weight of a dextrin compound, said dextrin compound being non-gelling at temperatures up to 98° C. when heated in the presence of water, N-methylolacrylamide, and acid, and
(2) 35 to 70 parts by weight of at least one ethylenically-unsaturated monomer capable of reacting with at least one hydroxyl group of the dextrin compound, said oligomer having an average in the range of 0.1 to 0.7, and preferably 0.20 to 0.45, ethylenically-unsaturated moiety per every anhydroglucose unit and an equivalent weight of 440 to 990, and at least 75 weight percent of said oligomer being water-soluble at 20° C. in a concentration of at least 2.5 percent by weight.

The water-soluble ethylenically-unsaturated dextrin oligomers have the formula

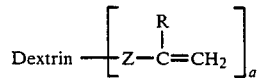

wherein
"Dextrin" is a carbohydrate intermediate in chain length between starch and glucose, Z is a divalent organo group linking the terminal ethylenically-unsaturated group to the dextrin chain, "a" represents the degree of substitution (D.S.) in the range of 0.1 to 0.7, and R is a member selected from the group consisting of hydrogen and lower alkyl radicals, i.e. radicals having from 1 to 4 carbon atoms.

Preferably R is hydrogen, a methyl group, or an ethyl group. Preferably, "a" is 0.20 to 0.45.

Examples of ethylenically-unsaturated dextrin oligomers suitable for this invention include:

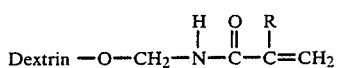   (1)

wherein R is H or lower alkyl,

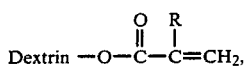   (2)

wherein R is H or CH$_3$,

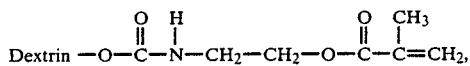   (3)

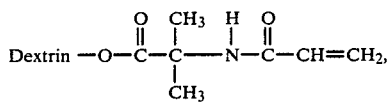   (4)

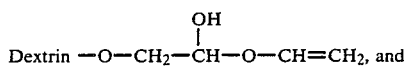   (5)

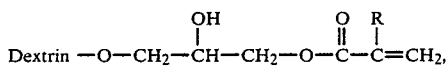   (6)

wherein R is H or

Z is a divalent organo linking group comprising a small number of carbon, nitrogen, and oxygen atoms (preferably 9 atoms or less) and as high a ratio of hetero atoms (nitrogen, oxygen) to carbon atoms as possible. Examples of Z include:

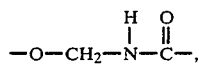

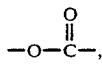

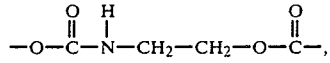

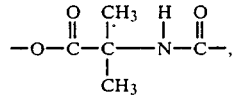

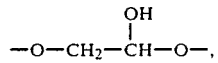

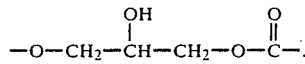

The preferred Z has the following structure:

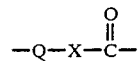

where Q is a divalent organo group preferably having 6 atoms or less with as high a ratio of hetero atoms (nitrogen, oxygen) to carbon atoms as possible and X is N-H or O. The most preferred Z has the structure

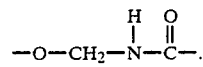

Dextrins are produced from starch by hydrolysis with dilute acids, amylase, or dry heat, in the presence of an acid catalyst so as to produce fragments having a molecular weight lower than that of the original starch.

The ethylenically unsaturated dextrin oligomers to be used in the present invention can be prepared by the following general method:

A. To a glass or glass-lined reaction vessel fitted with an agitator, an overhead condenser suitable for distillation, a temperature control, and an inert air sweep, is added 35 to 70 parts by weight of N-methylolacrylamide 60 to 120 parts by weight of water, 1 to 6 parts by weight of acrylic or other carboxylic acid catalyst and 0.0002 to 0.0006 parts by weight of a free radical polymerization inhibitor such as phenothiazine.

B. To this mixture is added, with agitation, 100 parts by weight of a suitable dextrin.

C. The mixture is agitated until uniform and then heated to 82°–98° C. with an inert air sweep.

D. When 30 to 60 parts by weight of water has been distilled and collected, the batch is cooled to about 27° C. and 75 to 150 parts by weight of deionized water is added.

E. The cool solution is filtered and added with agitation during a 10 to 20 minute period to 1200 to 2400 parts by weight of methanol in a glass or glass lined vessel.

F. The product is filtered and vacuum or forced air dried for several days until substantially free of solvent to give 110 to 210 parts by weight of a chunky white solid.

G. The product is analyzed for residual monomer and incorporated unsaturation using proton and $^{13}$C nmr spectroscopy. Alternatively, residual monomer can be analyzed for by using a 300 mm×7.8 mm HPLC (high performance liquid chromatography) carbohydrate analysis column (Aminex® Carbohydrate HPX042, BioRad Corp.).

The incorporated unsaturation from reacted monomer can vary from 20 to 45 mole percent, and unreacted monomer is usually found to be less than one weight percent. This means that it is possible to make dextrin oligomers with equivalent weights of unsaturation of 440 to 990.

The dextrins which can be used for preparing oligomers useful in the present invention are those which will not gel when heated with acrylic acid and N-methylol acrylamide. These dextrins are defined as "stable" dextrins.

Commercially available dextrins which are suitable for preparing the oligomers to be used in the present invention include Amaizo ®1407, Amaizo ®1740, and Amaizo ®1895, available from American Maize Products Co., Stadex®27, Stadex®50, and Stadex®140, available from A. E. Staley Manufacturing Co., and Excello®8051, available from Corn Products Company.

Monomers useful in preparing the photopolymerizable composition are free-radical initiated, chain propagating, addition polymerizable, ethylenically unsaturated compounds which are substantially soluble in water and which, upon photoinitiated polymerization with themselves or with the above described ethylenically unsaturated dextrin oligomer, form hydrophilic polymers which are substantially insoluble in water. Particularly preferred monomers of this type are those which contain both hydroxyl and acrylamide groups. Examples of suitable monomers include N-methylolacrylamide, dihydroxyethylene-bis-acrylamide, 1,4-diacrylamido-2,3-dihydroxy butane, 1,3-diacrylamido-2-hydroxypropane, and 1-acrylamido-2,3-dihydroxypropane. The purpose of the hydroxyfunctional monomers is to (a) promote cross-linking of the ethylenically unsaturated dextrin oligomer and to (b) plasticize the composition. Preferably more than one monomer is employed, because it has been found that the use of more than one monomer minimizes the tendency or monomers to crystallize in the dry coating.

The solid particulate material should be inorganic and preferably should have a relatively high surface area, e.g. 200–400 m²/g. The particulate material not only contributes to the wet strength and scratch resistance of the polymerized composition, but it also helps to reduce the tack of the photosensitive element under conditions of high humidity. The particulate material should be inorganic in order to be compatible with the other ingredients of the hydrophilic composition. The preferred particulate materials are silicas, the most preferred being low or medium density silica gels. Commercially available particulate materials useful in the composition include Syloid®244, manufactured by W. R. Grace & Co., and Silcron®G-100, manufactured by SCM Glidden Pigments.

The photopolymerizable composition is activatable by actinic radiation. Since free-radical generating, addition-polymerization initiators activatable by actinic radiation generally exhibit their maximum sensitivity in the ultraviolet range, the radiation source should usually furnish an effective amount of this type of radiation. Suitable radiation sources include mercury and mercury-metal halide lamps, xenon lamps, and carbon arcs.

Free radical generating, addition polymerization initiators suitable for the present invention must be soluble in water. Suitable water-soluble polymerization initiators include, for example, aromatic diazonium salts and aromatic iodonium salts. These materials, in general, must have photosensitizers therewith to form a photoinitiation system.

The photosensitizer should be capable of absorbing radiation in the range 320–420 nm and should be water-soluble in order to be useful in an aqueous solution.

The preferred photosensitizer for the photoinitiation system is a salt of a compound having the formula

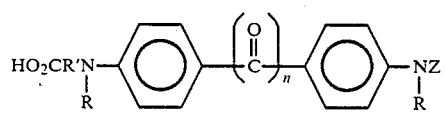

III wherein each

R is an alkyl group of 1 to 8 carbon atoms,
R' is an alkylene group having 1 to 8 carbon atoms,
Z is R'COOH or R'H, and
n is an integer having a value of 1 or 2.

The foregoing compound is referred to as a water-soluble Michler's ketone analog. Water-soluble Michler's ketone analogs and methods for preparation thereof are fully described in assignee's copending patent application, U.S. Ser. No. 471,838, filed on even date herewith, and incorporated herein by reference. In the presence of radiation in the 320–420 nm range, the photosensitizer causes decomposition of known free radical initiators such as iodonium salts, biimidazoles, trialkylphosphites, alkyl peroxides, benzyl halides, alkyl nitrates, and benzophenones into free radicals that initiate polymerization in ethylenically unsaturated materials such as those having acrylate, methacrylate, acrylamide, and methacrylamide groups, and in allyl and vinyl monomers.

The water-soluble Michler's ketone analog can be converted to a salt by the neutralization of the acid form compound of Formula III, by using inorganic bases, such as metal hydroxides, e.g., NaOH, or organic bases, such as amines, e.g., triethylamine. The salt has the formula

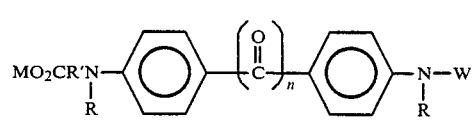

IV wherein
R, R' and n are defined as above,
M is a cation (e.g., an alkali or alkaline earth metal ion or a substituted alkyl ammonium ion such as a trialkylammonium ion or hydroxyalkylammonium ion), and
W is R'COOM or R'H.

The preferred photosensitizer is the sodium salt of

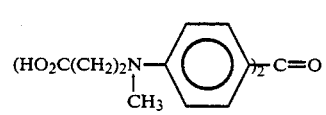

V 4,4'-bis(N-2-carboxyethyl-N-methylamino)benzophenone.

When n is equal to 1, the photosensitizers can be prepared by the following procedure:

(1) reacting equivalent amounts of the appropriate substituted aniline compound and methyl acrylate at a temperature of 110° C. for 72 hours in the presence of a catalytic amount of acetic acid,
(2) purifying the reaction product by distillation,
(3) condensing one equivalent of the reaction product with 2 equivalents of formaldehyde by heating at 80° C. for 17 hours in the presence of mineral acid, such as HCl, and a low molecular weight alcohol, having the same alkyl group as the acrylate, to produce the bis compound reaction product,
(4) oxidizing one equivalent of the bis reaction product with two equivalents of 2,3-dichloro-5,6-dicyano-1,4-benzoquinone (DDQ) by heating to reflux for one hour,
(5) hydrolyzing the resulting keto-diester for one hour in the presence of sodium hydroxide and methanol to liberate the carboxyl group, (6) neutralizing the product of step (5) with dilute sulfuric acid to obtain the free acid in crystalline form.

To obtain the salt form of the water-soluble Michler's ketone analog, the compound of step (6) can be neutralized with an inorganic or organic base.

Appropriate aniline compounds for step (1) can be represented by the formula:

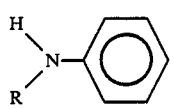   VI wherein R is an alkyl group of 1 to 8 carbon atoms.

The preferred photoinitiation system is a combination of at least one diaryliodonium salt and at least one water-soluble Michler's ketone analog. A particularly preferred photoinitiation system is the combination of diphenyliodonium hexafluorophosphate and 4,4'-bis(N-2-carboxyethyl-N-methylamino)benzophenone disodium salt.

Small amounts of water dispersible pigments, i.e. about 1 to 10 weight percent, based on the weight of composition of this invention, can be added to the photopolymerizable composition to impart color to the photopolymerized layer so that a visible image of the photopolymer is provided. This visible image is useful for providing contrast between the background area and the image area. A preferred pigment is Colanyl Red, available from American Hoechst Corp., because it is compatible with the other components of the composition.

The photopolymerizable composition can also contain wetting agents, e.g. surfactants or alcohols, in order to wet the oleophilic surface upon which the hydrophilic composition is being coated. A commercially available wetting agent is an octylphenoxy polyethoxy ethanol, Triton®X-100, available from Rohm and Haas Co.

The pH of the coating solution may require adjustment in order to stabilize the pigment and keep the photosensitizer soluble. Suitable pH adjusters include amines and inorganic hydroxides.

The concentration range of each ingredient in the photopolymer composition of the present invention per 100 parts total can be as follows:
- 20 to 60 parts by weight of ethylenically unsaturated dextrin oligomer,
- 10 to 30 parts by weight of at least one hydroxyfunctional acrylamide monomer,
- 10 to 40 parts by weight of solid inorganic particulate material, and
- 1 to 7 parts by weight of a photoinitiation system.

Preferably, the photopolymerizable composition contains, per 100 parts total weight, 30 to 50 parts by weight of ethylenically unsaturated dextrin oligomer, 15 to 25 parts by weight of at least one hydroxyfunctional acrylamide monomer, 20 to 30 parts by weight of inorganic solid particulate material, and 1 to 7 parts by weight of photoinitiation system. As stated previously, the photoinitiation system includes a photosensitizer and a photoinitiator. The photoinitiation system preferably contains about 1 to about 5 parts by weight of photoinitiator and about 1 to about 5 parts by weight of photosensitizer.

To combine the ingredients to form the photopolymerizable composition, all water-soluble components of the composition are dissolved in water, preferably with mechanical stirring. The filler can be ball milled with the aqueous solution of the water-soluble components to form a dispersion.

The foregoing photopolymerizable composition is applied as a top coat over an oleophilic layer, which has been previously applied to a suitable substrate. Suitable substrates include metals, such as aluminum, or polymer materials, such as polyesters and polyolefins. The hydrophilic composition of this invention may be applied by skim coating, wire wound rod coating, extrusion bar coating, or other conventional coating technique. After the solvent, water, has evaporated, the element is ready for use.

To prepare a positive acting lithographic printing plate, the element can be exposed through a process positive transparency in a vacuum frame under a source of ultraviolet light. After exposure, the plate can be developed by wiping with water, which dissolves and removes the unpolymerized portion of the top layer.

The thus-formed lithographic plate has no post development sensitivity to white fluorescent light. This characteristic is valuable because press durability, run length, and solvent resistance will not be diminished by exposure to room lights after processing. Furthermore the plate needs no gumming or desensitization of any kind after development with ordinary tap water. The photopolymer background retains its hydrophilicity even after long periods of storage.

The plate requires about one-fourth to about one-half of the exposure of a diazo oxide-phenolic based conventional state of the art positive plate.

Based on accelerated press testing, it is estimated that the average run length of the plate when prepared with a slurry brush grained (unanodized) aluminum substrate would be in excess of 50,000 impressions.

The invention will now be further illustrated by the following, non-limiting, examples.

EXAMPLE I

The following ingredients, in the amounts indicated, were employed for preparing the oleophilic layer:

| Ingredient | Amount |
| --- | --- |
| Ethylenically unsaturated urethane oligomer (Oligomer A, U.S. Ser. No. 270,841) | 18.4 g |
| Diphenyliodonium hexafluorophosphate | 0.8 g |
| Michler's ketone (4,4'-Bis(dimethylamino)benzophenone) | 0.8 g |
| Quartz, 8 micrometer (μm) mean particle size, treated with 5% gamma-methacryloxypropyltrimethoxysilane [(CH$_2$=C(CH$_3$)CO$_2$(CH$_2$)$_3$Si(OCH$_3$)$_3$] | 20.0 g |
| 1,1,2-Trichloroethylene | 20.0 g |
| Methyl ethyl ketone | 20.0 g |

Oligomer A, which was also used for preparing the oleophilic layer in Examples II, III, and IV, was prepared by the procedure set forth in Example I of assignee's copending application, Hegel, U.S. Ser. No. 270,841, filed June 5, 1981, incorporated herein by reference. This procedure is as follows:

Into a reaction flask equipped with an agitator, liquid addition funnel, thermometer, and inlet tube for the introduction of a dry nitrogen atmosphere were placed 600 g (0.6 mole) of "Lexorez" 5171-280 (a polyester polyol derived from trimethylolpropane, dipropylene glycol, adipic acid, and phthalic anhydride, having a hydroxyl functionality of 5 to 7, and hydroxyl equivalent weight of 280, commercially available from Inolex Corporation), 1.5 g dibutyltin diluarate, and 2.1 g "Irganox" 1010 antioxidant ((tetrakis)3-(3,5-di(t-butyl)-4-hydroxyphenyl)propionyloxymethyl)methane, commercially available from Ciba Geigy Inc.). The resulting mixture was agitated, and 465 g (3.0 moles) of 2-isocyanatoethyl methacrylate was added to the reaction flask over a 30 minute period, with the rate of addition of the 2-isocyanatoethyl methacrylate being adjusted to keep the temperature of the reaction mixture from exceeding about 75° C. A heating mantle was placed about the reaction flask, and the reaction mixture was heated for an additional 30 minutes at a temperature of about 70° to 75° C., until infrared analysis of the reaction mixture indicated that the isocyanate groups had been consumed. The resulting product, Oligomer A, is represented by the following structural formula:

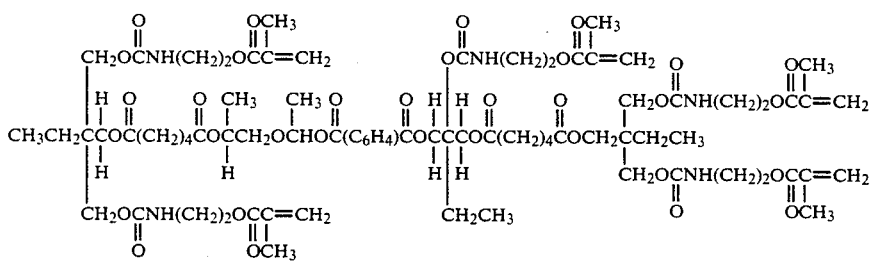

A slurry was prepared by combining the ingredients for the oleophilic layer in a 200 cc jar and milling with glass marbles for 26.5 hours on a two roll mill. Slurry brush grained aluminum was subbed with this slurry by coating with a #4 wire round rod, drying one minute at 66° C. (150° F.), and irradiating 40 seconds at a distance of 20.3 cm (8 inches) from a 5 Kw mercury metal halide light source.

The following ingredients, in the amounts indicated, were employed for preparing the hydrophilic layer:

| Ingredient | Amount |
| --- | --- |
| Water | 10.0 g |
| 1,3-Diacrylamido-2-hydroxypropane | 1.3 g |
| 2,3-Dihydroxyl-1-acrylamidopropane (31% aqueous solution) | 2.1 g |
| Colanyl Red pigment (50% aqueous dispersion) | 0.67 g |
| Silica gel (Syloid ® 244, W. R. Grace & Co.) | 1.95 g |
| Diphenyliodonium hexafluorophosphate | 0.1 g |
| 4,4'-Bis-(N—2-carboxyethyl-N—methyl-amino)benzophenone disodium salt (2% aqueous solution) | 7.7 g |
| Acrylamidomethyl dextrin (D.S. = 0.32, prepared from Stadex ® 140) | 3.0 g |

The acrylamidomethyl dextrin for this Example, and for Examples II, III, and IV, was prepared according to the following procedure:

To a 94.6 liter (25 gallon) glass-lined kettle fitted with an anchor agitator, an overhead condenser suitable for distillation, a temperature control, and an inert air sweep was added 11.1 kg (24.6 lb.) N-methylolacrylamide in 12.1 kg (26.7 lb.) water, 0.72 kg (1.6 lb.) acrylic acid, 7.5 g phenothiazine, and 6.3 kg (14.0 lb.) deionized water. To this mixture, 20.7 kg (46 lb.) of the corn-based dextrin, Stadex®140, was added with agitation. The mixture was agitated until uniform and then heated to 91° C. (195° F.) with an inert air sweep. When 8.9 kg (19.8 lb.) of water was distilled and collected, the batch was cooled to 27° C. (80° F.) and 23.4 kg (52 lb.) of deionized water added. The cool solution was filtered and added over a 15 minute period to 375 kg (833 lb.) methanol in a 568 liter (150 gal.) glass-lined kettle with agitation. The product was vacuum filtered and dried in trays at 38° C. (100° F.) for several days to give 33.8 kg (75 lb.) of a chunky solid. The product contained 32 percent incorporated N-methylolacrylamide.

The disodium salt of 4,4'-Bis-(N-2-carboxyethyl-N-methylamino)benzophenone for this Example and for the following Examples was prepared by the following procedure:

N-methylaniline (375.2 g, 3.5 moles) was condensed with methyl acrylate (301.4 g, 3.5 moles) in the presence of 35 ml of glacial acetic acid, by heating to 110° C. for 72 hours. The resulting product was isolated by distillation. Spectral analysis indicated the presence of the desired product having the formula

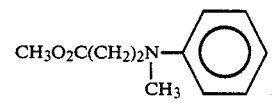

200.0 g (1.03 moles) of the intermediate product obtained above was condensed with 84.0 g (1.0 mole, 2.0 eq.) of 37 percent aqueous formaldehyde in the presence of 13.5 g of concentrated hydrochloric acid and 600 ml of methanol. The mixture was refluxed for 18.5 hours. The reaction product was extracted, washed, and dried. Spectral analysis indicated the presence of the bis compound reaction product having the formula

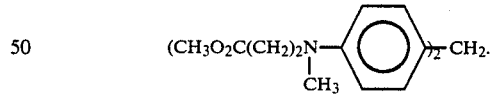

A solution of 8.80 g (0.022) moles of the bis compound reaction product in 20 ml of methanol and 5 ml of chloroform was stirred for 15 minutes and then DDQ (10.0 g, 0.044 moles) was added over a 5-minute period. The reaction mixture was stirred for 5 minutes at room temperature and for 1 hour at reflux. The keto-diester reaction product was extracted, washed, dried, chromatographed, and then identified by spectral analysis as the compound

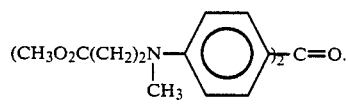

3.51 g (8.51 mmol) of the keto-diester in 125 ml of 10 percent sodium hydroxide/methanol was refluxed for 1 hour and was completely converted to the keto-diacid. The keto-diacid was acidified with aqueous sulfuric acid and the crystals produced were purified by recrystallization from ethanol and identified by spectral and combustion analysis as a compound having the formula analysis as a compound having the formula

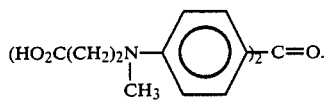

The thus-obtained free acid was dissolved by combining 1.0 g of the acid with 49 g of 0.1N sodium hydroxide solution and stirring. A small amount of sodium hydroxide solution or photosensitizer was added as needed to adjust the pH to 7.8.

Turning now to the preparation of the hydrophilic composition, the water-soluble ingredients were dissolved in the water. Dispersion of the silica was achieved by milling with glass marbles for about 3 days. The dispersion was coated over the above described subbed aluminum with a wire round rod and dried for two minutes at 66° C. (150° F.). The dry coating weight was about 4.12 g/m² (385 mg/ft²).

The resulting plate was exposed through a 21 step sensitivity guide for 5 seconds in a Berkey Ascor Vacuum Printer and then developed with water.

A ghost step 7 was observed and the weight loss of coating on development was determined to be 5%. "Ghost step" is the lowest exposure step where an image is visibly discernible from the background. Clearly, the coating was almost completely insoluble in water after irradiation.

EXAMPLE II

A 2% stock solution of photosensitizer was prepared by combining 1.0 g of 4,4′-bis(N-2-carboxyethyl-N-methylamino)benzophenone with 49 g of 0.1N sodium hydroxide solution and stirring. A small amount of additional sodium hydroxide or photosensitive was added to adjust the solution to pH 7.8. A solution was prepared by stirring 6.0 g acrylamidomethyl dextrin (D.S.=0.32, prepared from Stadex ®140), 54 g water, 2.6 g 1,3-diacrylamido-2-hydroxypropane, and 4.2 g of a 31% aqueous solution of 1-acrylamido-2,3-dihydroxypropane until all components were dissolved. The pH was adjusted to 8.0 using aqueous ethanolamine, and the solution was filtered through Miracloth ®. To this solution were added 3.9 g silica gel (Syloid ®244), 1.8 g Colanyl Red pigment (50% solids) and 0.04 g octylphenoxy polyethoxy ethanol (Triton ®X-100). The mixture was placed in a jar containing glass marbles and milled for four days. After this time 15.4 g of the 2% photosensitizer solution described above and 0.2 g diphenyliodonium hexafluorophosphate were added to the milled composition. This final dispersion was milled an additional 2 hours before coating. It will be referred to as Dispersion A.

The following ingredients, in the amounts indicated, were employed for preparing the oleophilic layer:

| Ingredient | Amount |
| --- | --- |
| Ethylenically unsaturated urethane oligomer (Oligomer A, U.S. Ser. No. 270,841) | 9.2 g |
| Diphenyliodonium hexafluorophosphate | 0.4 g |
| Michler's ketone (4,4′-Bis(dimethylamino)benzophenone) | 0.4 g |
| 1,1,2-Trichloroethylene | 10.0 g |
| Methyl ethyl ketone | 10.0 g |
| Quartz, 8 μm mean particle size, treated with 5% gamma-methacryloxypropyltrimethoxysilane [(CH$_2$=C(CH$_3$)CO$_2$(CH$_2$)$_3$Si(OCH$_3$)$_3$] | 10.0 g |

A slurry was prepared by combining the foregoing ingredients in a jar and milling for 54 hours on a two roll mill. The resulting slurry was coated on slurry brush grained aluminum having an arithmetic average roughness of about 15 microinches (0.38 micrometer) with a #3 wire wound rod and dried for 2 minutes at 66° C. (150° F.). The dry coating weight was determined to be 5.35 g/m² (500 mg/ft²). This coating was cured by irradiation for 40 seconds at a distance of 20.3 cm (8 inches) from a 5 Kw mercury metal halide lamp. The cured coating had an arithmetic average roughness of 35 microinches (0.89 micrometer) as measured with a surface roughness measuring device. In this application the device employed was a Surfanalyzer ™, manufactured by Federal Products, Incorporated, hereinafter referred to as Surfanalyzer ™.

Dispersion A was coated over the above substrate with a #10 wire wound rod and dried 2 minutes at 66° C. (150° F.). The dry coating weight was about 3.21 g/m² (300 mg/ft²). The two layer construction was exposed for 3 seconds through a 21 step sensitivity guide in a Berkey Ascor Vacuum Printer and developed with water. A ghost step 6 was observed.

EXAMPLE III

A solution was prepared by stirring 3.0 g acrylamidomethyldextrin (D.S.=0.32, prepared from Stadex ®140), 27 g water, 1.3 g of 1,3-diacrylamido-2-hydroxypropane, and 2.1 g of a 31% aqueous solution of 1-acrylamido-2,3-dihydroxypropane until the solids were dissolved. The pH was adjusted to about 8.5 with 10% aqueous triethylamine, and the solution was filtered through Miracloth ®. To this solution were added 0.2 g of 10% aqueous solution of octylphenoxy polyethoxy ethanol (Triton ®X-100), 0.9 g of Colanyl Red pigment (50% solids) and 1.93 g of silica gel (Syloid ®244). The resulting mixture was milled 2½ days with glass marbles. After this time, 7.7 g of a 2% 4,4′-bis(N-2-carboxyethyl-N-methylamino)benzophenone disodium salt solution (pH 8) along with 0.1 g diphenyliodonium hexafluorophosphate were added to the dispersion.

Two slurries, Slurry A and Slurry B, were prepared by combining the following ingredients in the amounts indicated.

| Ingredient | Amount, grams Slurry A | Slurry B |
| --- | --- | --- |
| Ethylenically unsaturated urethane oligomer (Oligomer A, U.S. Ser. No. 270,841) | 9.1 | 9.1 |
| Diphenyliodonium hexafluorophosphate | 0.4 | 0.4 |
| Michler's ketone (4,4′-Bisdimethylaminobenzophenone) | 0.4 | — |
| 2-(p-hydroxyethoxystyryl)-4,6-(bis(trichloromethyl)-s-triazine | — | 0.4 |

| Ingredient | Amount, grams | |
|---|---|---|
| | Slurry A | Slurry B |
| 2-methacryloyloxyethyl-phosphate | 0.1 | 0.1 |
| 1,1,2-Trichloroethylene | 10.0 | 10.0 |
| Methyl ethyl ketone | 10.0 | 10.0 |
| Quartz, 8 μm mean particle size, treated with 5% gamma-methacryloxypropyl-trimethoxysilane | 10.0 | 10.0 |

The slurries were prepared by combining the listed ingredients and milling with glass marbles for about 24 hours on a roller mill.

Each slurry was coated on a separate slurry brush grained aluminum plate with a #5 wire round rod, dried two minutes at 66° C. (150° F.) and irradiated 40 seconds at a distance of 20.3 cm (8 inches) from a 5 Kw mercury metal halide lamp. The arithmetic average roughness of the cured coatings was 36–40 microinches (0.91–1.02 micrometer), as measured with a Surfanalyzer TM.

The previously prepared dispersion was applied over the coating formed from slurry A and over the coating formed from slurry B. The top coatings were dried for two minutes at 66° C. (150° F.) to give a coating weight of 3.00 g/m² (280 mg/ft²). The coated plates were then contact exposed through positive lith film with a range of half tone dots and a 21 step sensitivity guide. Plates from slurry A were given a 5.3 second exposure and plates from slurry B a 3 second exposure. After development with water, a ghost step 6 was obtained. Plates were mounted on a Miehle sheet fed press and an abrasive ink was used to print multiple copies. After 33,000 impressions the only sign of wear was a darkening in the 95 and 97% screens. There was no wear in the midtones, highlites, or solid image urea.

EXAMPLE IV

The following ingredients, in the amounts indicated, were employed for preparing the oleophilic layer:

| Ingredient | Amount |
|---|---|
| Ethylenically unsaturated urethane oligomer (Oligomer A, U.S. Ser. No. 270,841) | 109.6 g |
| Michler's ketone (4,4'-Bis(dimethyl-amino)benzophenone) | 4.0 g |
| Diphenyliodonium hexafluorophosphate | 4.0 g |
| Amorphous silica, 2.20 μm mean particle size, (Imsil ® A-10, Illinois Minerals Company) | 100.0 g |
| Methyl ethyl ketone | 122.0 g |
| N—propyl alcohol | 107.7 g |
| Water | 42.3 g |

A slurry was prepared by stirring the ingredients for about 3 hours using an air stirrer. The slurry was coated onto (poly)vinylidene chloride primed polyester, 7 mils in thickness, with a #9 wire wound rod and dried 2 minutes at 66° C. (150° F.). The dried coating was irradiated 40 seconds at a distance of 20.3 cm (8 inches) from a 5 Kw mercury metal halide lamp. The arithmetic average roughness of the cured coating was 32–34 microinches (0.81–0.86 micrometer). This substrate was overcoated with the aqueous dispersion described in Example I. The coated plate was dried, contact exposed, developed with water, and run on press as described in Example III. The plate printed 12,000 impressions using a coarse ink without failure of the adhesion between any of the layers at any of the interfaces.

Various modifications and alterations of this invention will become apparent to those skilled in the art without departing from the scope and spirit of this invention, and it should be understood that this invention is not to be unduly limited to the illustrative embodiments set forth herein.

What is claimed is:

1. A photosensitive composition capable of providing a cross-linked hydrophilic photopolymer comprising
    (a) an ethylenically unsaturated dextrin oligomer having a degree of substitution of about 0.20 to about 0.45,
    (b) at least one hydroxyfunctional acrylamide monomer,
    (c) inorganic solid particulate material, and
    (d) a photoinitiation system, said composition, upon undergoing photopolymerization, forming a cross-linked hydrophilic photopolymer.

2. The composition of claim 1 wherein the dextrin oligomer has the formula

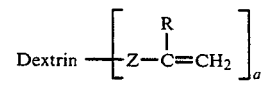

wherein
"Dextrin" is a carbohydrate intermediate in chain length between starch and glucose,
Z is an organo linking group having up to 9 atoms selected from carbon, nitrogen, and oxygen,
"a" represents the degree of substitution and has a value of 0.20 to 0.45, and
R is a member selected from the group consisting of hydrogen and lower alkyl radicals, wherein said radicals have from 1 to 4 carbon atoms.

3. The composition of claim 2 wherein Z is selected from the group consisting of

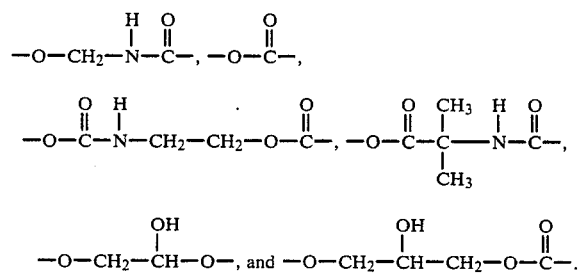

4. The composition of claim 1 wherein the hydroxyfunctional monomer is a mixture of at least one monoacrylamide monomer and at least one polyacrylamide monomer.

5. The composition of claim 4 wherein the monomers are 2,3-dihydroxy-1-acrylamidopropane and 1,3-diacrylamide-2-hydroxypropane.

6. The composition of claim 1 wherein the inorganic solid particulate material is silica gel.

7. The composition of claim 1 wherein the photoinitiation system comprises:
    (a) a water soluble Michler's ketone analog
    (b) a diaryliodonium salt.

8. The composition of claim 1 and further including a wetting agent.

9. The composition of claim 8 and further including a pH modifier.

10. The composition of claim 1 comprising from about 20 to about 60 parts of an ethylenically unsaturated dextrin oligomer, from about 10 to about 30 parts of at least one hydroxyfunctional acrylamide monomer, from about 10 to about 40 parts of an inorganic filler, from about 1 part to about 7 parts photoinitiation system.

11. A polymer prepared by exposing the composition of claim 1 to an effective amount of actinic radiation.

* * * * *

UNITED STATES PATENT AND TRADEMARK OFFICE
CERTIFICATE OF CORRECTION

PATENT NO. : 4,511,646
DATED : April 16, 1985
INVENTOR(S) : Elsie A. Fohrenkamm and Alan D. Rousseau It is certified that error appears in the above-identified patent and that said Letters Patent is hereby corrected as shown below:

Col. 3, line 40, after "wherein R is H or" insert $--CH_3--$.

Col. 11, line 44, "photosensitive" should read --photosensitizer--.

Signed and Sealed this

Thirtieth Day of July 1985

[SEAL]

Attest:

DONALD J. QUIGG

*Attesting Officer*     *Acting Commissioner of Patents and Trademarks*